(12) United States Patent
Popp et al.

(10) Patent No.: US 9,741,781 B2
(45) Date of Patent: Aug. 22, 2017

(54) OPTOELECTRONIC COMPONENT WITH ADJUSTABLE LIGHT EMISSION AND METHOD FOR PRODUCING THE SAME

(71) Applicant: OSRAM OLED GmbH, Regensburg (DE)

(72) Inventors: Michael Popp, Freising (DE); Arndt Jaeger, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 31 days.

(21) Appl. No.: 14/892,646

(22) PCT Filed: May 21, 2014

(86) PCT No.: PCT/EP2014/060421
§ 371 (c)(1),
(2) Date: Nov. 20, 2015

(87) PCT Pub. No.: WO2014/187853
PCT Pub. Date: Nov. 27, 2014

(65) Prior Publication Data
US 2016/0148987 A1  May 26, 2016

(30) Foreign Application Priority Data

May 22, 2013  (DE) .................. 10 2013 105 229

(51) Int. Cl.
*H01L 27/32* (2006.01)
*H01L 27/28* (2006.01)
(Continued)

(52) U.S. Cl.
CPC ........ *H01L 27/3269* (2013.01); *H01L 27/288* (2013.01); *H01L 27/322* (2013.01);
(Continued)

(58) Field of Classification Search
CPC . H01L 27/3269; H01L 27/288; H01L 27/322; H01L 51/5246; H01L 51/5262;
(Continued)

(56) References Cited

U.S. PATENT DOCUMENTS 6,282,340 B1 * 8/2001 Nasu ................. G02B 6/02085
372/20
6,343,171 B1 * 1/2002 Yoshimura ......... G02B 6/12002
257/E23.01
(Continued)

FOREIGN PATENT DOCUMENTS

DE        10031294 A1     1/2002
DE   102007022090 A1    11/2008
(Continued)

OTHER PUBLICATIONS

Machine translation, Nitobe, Japanese Patent Publication No. 2008-65107, translation date: Feb. 12, 2017, Espacenet, all pages.*

*Primary Examiner* — Victoria K Hall
(74) *Attorney, Agent, or Firm* — Viering, Jentschura & Partner mbB

(57) ABSTRACT

Various embodiments may relate to an optoelectronic component, including an optoelectronic structure, which is designed to provide a first electromagnetic radiation, and a measuring structure, which is designed to measure electromagnetic radiation, wherein the measuring structure has an optically active structure and at least one electro-optical structure. The optically active structure is optically coupled to the optoelectronic structure. The optically active structure is designed to absorb an electromagnetic radiation in such a way that the optically active structure produces a measured signal from the absorbed electromagnetic radiation. The absorbed electromagnetic radiation at least partially includes the first electromagnetic radiation and/or at least one second
(Continued)

electromagnetic radiation of an external radiation source. The electro-optical structure is designed in such a way that the electro-optical structure has an adjustable transmittance, such that the fraction of the second electromagnetic radiation incident on the optically active structure can be adjusted.

12 Claims, 5 Drawing Sheets

(51) Int. Cl.
*H01L 51/52* (2006.01)
*H01L 51/56* (2006.01)
*G01J 1/04* (2006.01)

(52) U.S. Cl.
CPC ...... *H01L 51/5246* (2013.01); *H01L 51/5262* (2013.01); *H01L 51/5271* (2013.01); *H01L 51/56* (2013.01); *G01J 1/0448* (2013.01); *H01L 2227/323* (2013.01); *H01L 2251/5361* (2013.01)

(58) Field of Classification Search
CPC ................ H01L 51/65; H01L 51/5271; H01L 2227/323; H01L 2251/5361; G01J 1/0448
See application file for complete search history.

(56) References Cited

U.S. PATENT DOCUMENTS

| | | | | |
|---|---|---|---|---|
| 6,611,635 B1* | 8/2003 | Yoshimura | ......... | G02B 6/12002 257/E23.01 |
| 2003/0214240 A1* | 11/2003 | Lee | ...................... | G09G 3/3208 315/169.1 |
| 2008/0284716 A1* | 11/2008 | Edwards | .............. | G09G 3/3406 345/102 |
| 2010/0171127 A1 | 7/2010 | Kanatake | | |
| 2015/0243710 A1* | 8/2015 | Popp | .................... | H01L 51/448 315/158 |
| 2015/0270313 A1* | 9/2015 | Popp | ................... | H01L 27/3269 315/152 |
| 2015/0333106 A1* | 11/2015 | Popp | ................... | H01L 51/5281 315/151 |
| 2015/0340409 A1* | 11/2015 | Popp | ..................... | H01L 27/288 315/150 |

FOREIGN PATENT DOCUMENTS

| | | | | |
|---|---|---|---|---|
| DE | 102009034250 | A1 | 1/2011 | |
| DE | 212008000100 | U1 | 2/2011 | |
| EP | 1601030 | A2 | 11/2005 | |
| JP | 2008-65107 | * | 3/2008 | ............. G02F 1/133 |
| JP | 2008065107 | A | 3/2008 | |
| JP | 2013015817 | A | 1/2013 | |
| WO | 9803896 | A1 | 1/1998 | |
| WO | 9841899 | A2 | 9/1998 | |
| WO | 2007069107 | A2 | 6/2007 | |
| WO | 2009053890 | A2 | 4/2009 | |
| WO | 2009100776 | A1 | 8/2009 | |
| WO | 2010064165 | A1 | 6/2010 | |
| WO | 2012169415 | A1 | 12/2012 | |

OTHER PUBLICATIONS

Written Opinion of the International Searching Authority, WIPO, International Application No. PCT/EP2014/060421, dated Nov. 22, 2015, all pages.*
English translation, Nitobe, Japanese Pat. Pub. No. JP 2008-65107, translation date: Mar. 2017, Schreiber Translations, Inc., all pages.*
International Search Report based on application No. PCT/EP2014/060421 (3 pages and 2 pages on English Translation) dated Sep. 22, 2014 (for reference only).
German Search Report based on Application No. 10 2013 105 229.0 (4 Pages) dated Oct. 22, 2013 (Reference Purpose Only).
J. Jacobsen et al., The last book, IBM System Journal, 1997, vol. 36, No. 3, pp. 457-463.
B. Comiskey et al., An electrophoretic ink for all-printed reflective electronic displays, Nature, Jul. 16, 1998, vol. 394, pp. 253-255.

* cited by examiner

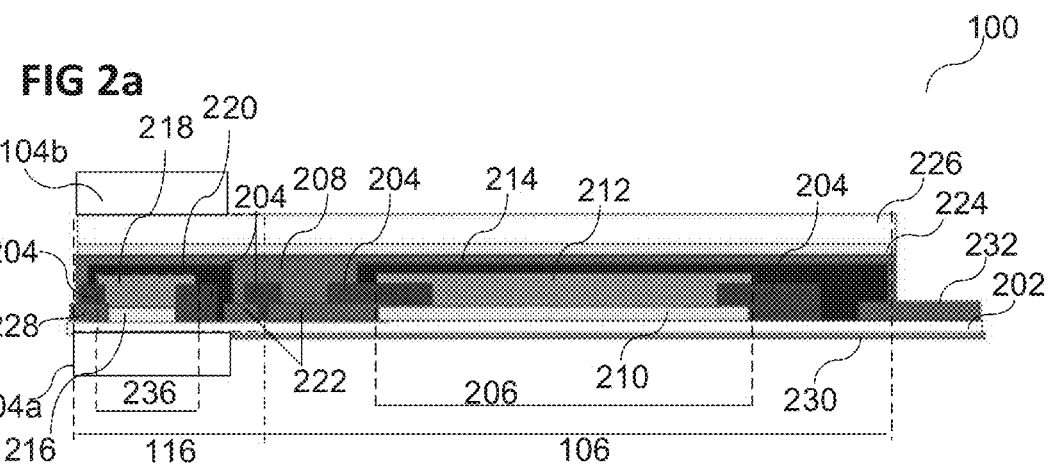
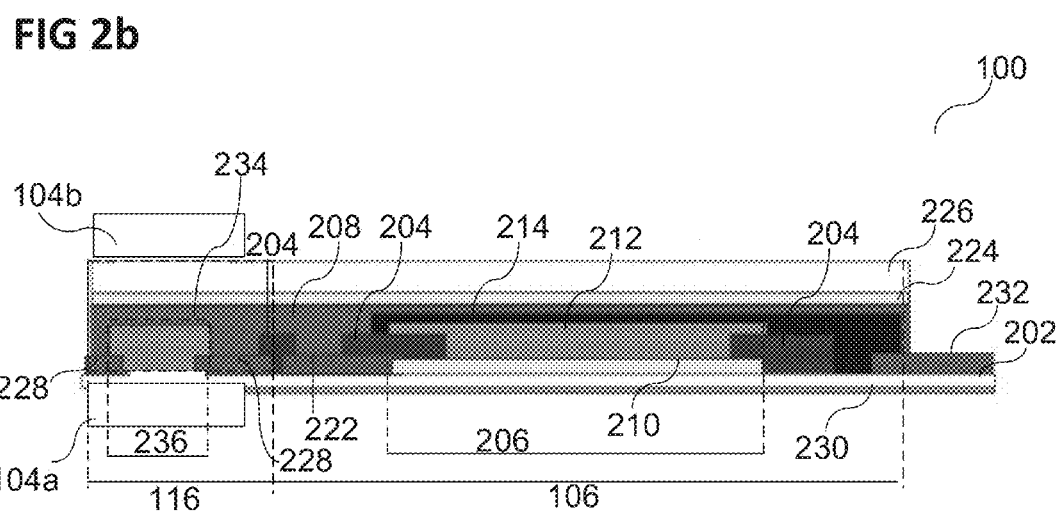

FIG 3A
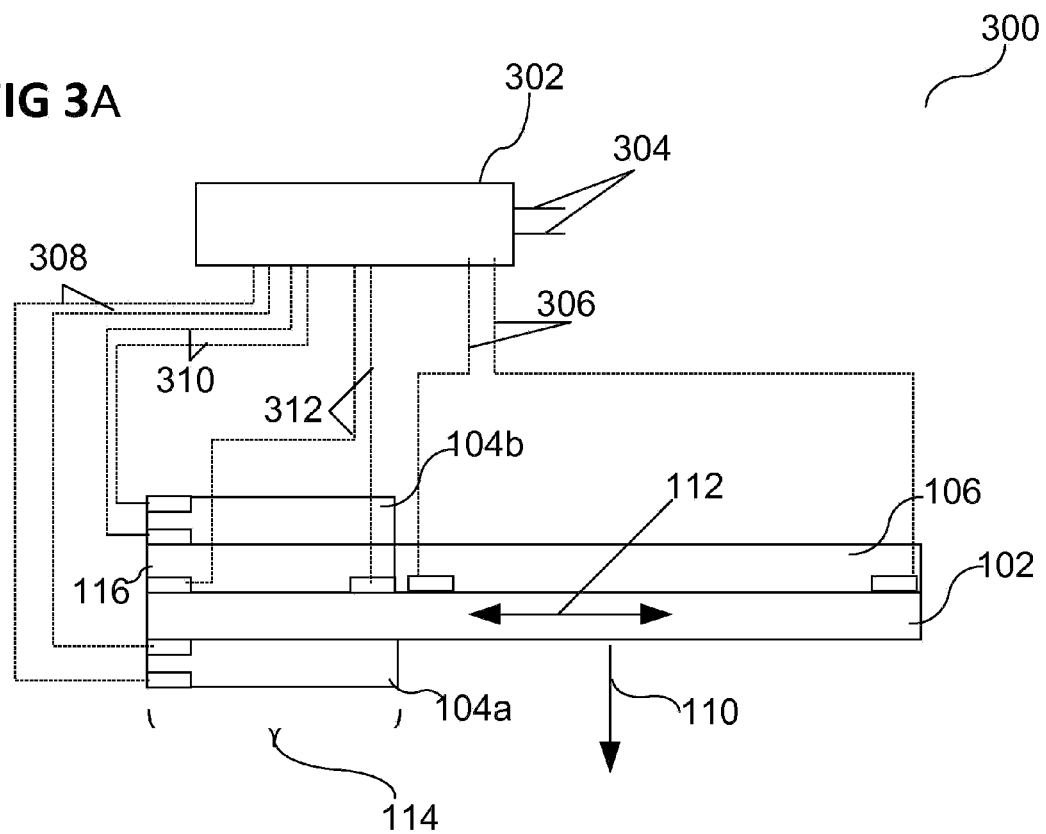
FIG 3B
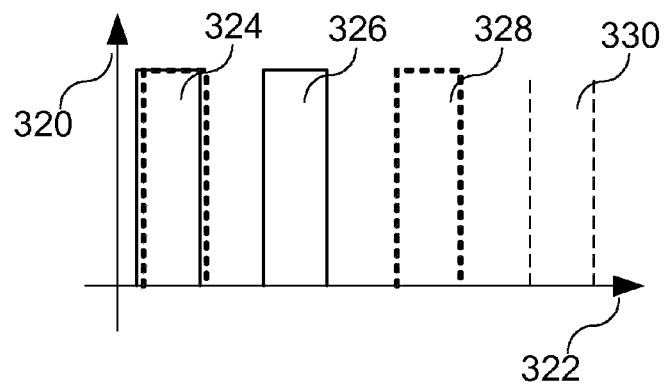

OPTOELECTRONIC COMPONENT WITH ADJUSTABLE LIGHT EMISSION AND METHOD FOR PRODUCING THE SAME

RELATED APPLICATIONS

The present application is a national stage entry according to 35 U.S.C. §371 of PCT application No.: PCT/EP2014/060421 filed on May 21, 2014 which claims priority from German application No.: 10 2013 105 229.0 filed on May 22, 2013, and is incorporated herein by reference in its entirety.

TECHNICAL FIELD

In various embodiments, an optoelectronic component and a method for producing an optoelectronic component are provided.

BACKGROUND

Organic light emitting diodes are being increasingly widely used in general lighting, for example as large-area luminous surfaces (surface light source). A conventional organic light emitting diode 502 (OLED) (FIG. 5) includes an anode 514 and a cathode 518 with an organic functional layer system 516 therebetween. The organic functional layer system 516 may include one or a plurality of emitter layer(s) in which electromagnetic radiation is generated, one or a plurality of charge generating layer structure(s) each composed of two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow. The OLED emission can easily be varied via the operating current of the OLED. Adaptation to external and internal light conditions is possible as a result.

The external light conditions can change (short-term process) e.g. if the OLED in a room with a window is exposed to the diurnally variable sunlight. Furthermore, the emitted wavelength spectrum of the OLED is subject to ageing processes (long-term process), such that, depending on the OLED layer construction and processing, the luminance typically decreases with time. The decrease in the luminance is brought about e.g. by increased current densities or temperatures which occur during the operation of the OLED and can damage the organic system.

In order to keep constant the luminance in the environment of the OLED surface light source with time, the luminance in the OLED-illuminated room can be kept constant by manual dimming or external switched-on sensors with electronic circuit.

In one conventional method, readjustment of the emitted wavelength spectrum of the OLED is dispensed with.

In one conventional method, the wavelength spectrum is manually readjusted, i.e. an automatic readjustment is not possible without additional outlay. However, the manual readjustment allows only inaccurate coordination of the emission spectrum with light conditions actually present, as a result of which electrical energy is wasted unnecessarily and an incorrect lighting condition is used.

In one conventional method, external photodiodes, photoconductors, phototransistors, photothyristors or the like are used for detecting the entire radiation, with external interconnection/wiring. The requisite circuit complexity and expenditure in terms of additional costs are high, however.

In a further method (FIG. 5), at least two photosensors 504, 506 are integrated for simultaneous detection of internal and external brightnesses, and different orientations (back/front), in the case of a surface light source 502. One photosensor 504 is covered by a diaphragm 508 with regard to external light, in order to measure the internal brightness of the OLED. Another photosensor 506 measures the internal light and the external light, wherein the internal measurement is reduced by a coupling-out structure 512. The differentiation of internal light and external light is made more difficult by this method, since external light and also internal light are guided in the waveguiding substrate 510. Freedom of design is restricted as a result of the loss of luminous area and the arrangement of the diaphragm 508.

Also known are electrically switchable mirror layers: DE100312941A1, DE102007022090A1; and electrically switchable diaphragms/filters: J. Jacobsen et al., IBM System Journal 36 (1997) 457-463; B. Comiskey et al. Nature 394 (1998) 253-255; WO199803896A1; WO199841899A1; WO2010064165A1; WO2009053890A2 and EP1601030A2.

SUMMARY

In various embodiments, an optoelectronic component and a method for producing an optoelectronic component are provided which enable an exact automatic readjustment of the optoelectronic properties of an optoelectronic component with just a single photosensor. As a result, the circuit complexity and space requirement for a brightness-readjusted OLED can be reduced, for example.

In various embodiments, an optoelectronic component is provided. The optoelectronic component includes an optoelectronic structure formed for providing a first electromagnetic radiation; and a measuring structure formed for measuring electromagnetic radiation, wherein the measuring structure includes an optically active structure and at least one electro-optical structure; wherein the optically active structure is optically coupled to the optoelectronic structure; wherein the optically active structure is formed for taking up an electromagnetic radiation in such a way that the optically active structure generates a measurement signal from the electromagnetic radiation taken up, wherein the electromagnetic radiation taken up at least partly includes the first electromagnetic radiation and/or at least one second electromagnetic radiation of an external radiation source; and wherein the electro-optical structure is formed in such a way that it has an adjustable transmittance, such that the proportion of the second electromagnetic radiation impinging on the optically active structure is adjustable.

In one configuration, the proportion of the electromagnetic radiation taken up that is constituted by the second electromagnetic radiation can be electrically adjustable by the electro-optical structure.

In one configuration, the optoelectronic component may furthermore include a waveguide, wherein the waveguide is formed in such a way that, at least partly with regard to the electromagnetic radiation taken up in the optically active structure, said waveguide is formed at least partly as an optical connection for the optoelectronic structure to the optically active structure and/or for the optically active structure to the electro-optical structure. The waveguide can be formed in such a way that the optoelectronic structure, the optically active structure and/or the electro-optical structure are/is optically coupled to the waveguide at least partly with regard to the electromagnetic radiation taken up in the optically active structure.

In one configuration, the waveguide can be formed as a planar waveguide.

In one configuration, the optoelectronic structure may include at least one organic functional layer structure between a first electrode and a second electrode, wherein the organic functional layer structure includes at least one electroluminescent layer.

In one configuration, the optoelectronic structure may include a plurality of organic functional partial structures.

In one configuration, the plurality of organic functional partial structures may include different emitter layers.

In one configuration, the different emitter layers can be formed for emitting different first electromagnetic radiation.

In one configuration, the plurality of organic functional partial structures can be formed alongside one another.

In one configuration, the plurality of organic functional partial structures can be formed one above another.

In one configuration, the plurality of organic functional partial structures can be formed in such a way that the plurality of organic functional partial structures at least partly include different first electrodes and/or second electrodes.

In one configuration, the optically active structure may include at least one of the following optically active components or be formed in such a way: a photoconductor, a light emitting diode, an organic light emitting diode, a photodiode, an organic photodiode, a solar cell, and/or an organic solar cell.

In one configuration, the optically active structure may include or be formed as a single optically active component.

In one configuration, the optically active structure may include an organic functional layer structure including at least one electroluminescent layer.

In one configuration, the electroluminescent layer of the optically active structure may include the same substance or the same substance mixture as the electroluminescent layer of the optoelectronic structure.

In one configuration, the optically active structure and the optoelectronic structure may include a common electroluminescent layer.

In one configuration, the optically active structure and the optoelectronic structure can be formed alongside one another in a planar fashion.

In one configuration, the optoelectronic structure may include a first optically active region and the electro-optical structure may include a second optically active region, wherein the first optically active region is larger than the second optically active region.

In one configuration, the optically active structure can be formed in the geometrical edge region of the optoelectronic structure.

In one configuration, the optoelectronic component may furthermore include a carrier, wherein the optically active structure and the optoelectronic component are formed on or above the carrier, for example on both sides of the carrier.

In one configuration, the carrier can be formed as a waveguide.

In one configuration, the electro-optical structure may include or be formed as at least one of the following electro-optical components: a mirror having electrically tunable reflectivity; a filter having electrically tunable absorption; and/or a diaphragm having electrically tunable transmission.

In one configuration, the electro-optical structure may include a plurality of electro-optical components, wherein at least two electro-optical components are formed in such a way that the optically active structure is formed optically between the at least two electro-optical components.

In one configuration, the optoelectronic component can furthermore include an optical coupling structure, wherein the optical coupling structure is formed between the electro-optical structure and the waveguide.

In one configuration, the optical coupling structure can be formed as a cohesive connection of electro-optical structure and waveguide, for example as an adhesive connection.

In one configuration, the coupling structure can be formed in such a way that the coupling structure has a layer-thickness-averaged refractive index having an absolute value with regard to the electromagnetic radiation taken up in the optically active structure, such that the reflection of the electromagnetic radiation guided in the waveguide back into the waveguide is reduced.

In one configuration, in which the waveguide and the optically active structure have an approximately identical refractive index, the coupling structure can have a refractive index like the waveguide or the optically active structure.

In one configuration, in which the waveguide and the optically active structure have a different refractive index, the coupling structure can have a refractive index that is between the refractive index of the waveguide and the refractive index of the optically active structure.

In one configuration, the coupling structure may include particles distributed in a matrix, wherein the particles have a refractive index difference with respect to the matrix with regard to the electromagnetic radiation taken up in the optically active structure, which difference is greater than 0.05.

In one configuration, the particles can be formed in such a way that the particles are scattering with regard to the electromagnetic radiation taken up in the optically active structure, for example have an average diameter that is greater than 100 nm.

In one configuration, the particles can be formed in such a way that the particles are non-scattering with regard to the electromagnetic radiation taken up in the optically active structure, for example have an average diameter that is less than 100 nm.

In one configuration, the particles and/or the matrix may be formed from or include a thermotropic substance in such a way that the coupling structure has a scattering effect during the operation of the optoelectronic structure.

In one configuration, the coupling structure can be formed as an optical cavity with regard to the electromagnetic radiation taken up in the optically active structure.

In one configuration, the optoelectronic component may furthermore include an encapsulation structure, wherein the encapsulation structure is formed in such a way that the optically active structure and/or the optoelectronic structure are/is hermetically sealed with regard to indiffusion of water and/or oxygen.

In one configuration, the electro-optical structure can be formed on or above the encapsulation structure.

In one configuration, the electro-optical structure can be formed as a part of the encapsulation structure.

In one configuration, the encapsulation structure may include the carrier and/or the waveguide, wherein the carrier and/or the waveguide are/is formed in hermetically impermeable fashion.

In one configuration, the encapsulation structure may include a barrier layer, a cover and/or a cavity glass encapsulation.

In one configuration, the optoelectronic component may furthermore include a control device, wherein the control device is formed for electrically driving the optoelectronic structure and/or the electro-optical structure.

In one configuration, the control device can be formed in such a way that it controls an optical property of the electro-optical structure.

In one configuration, the control device can be formed in such a way that the electrical driving of the electro-optical structure is formed in such a way that changing a voltage applied to the electro-optical structure alters at least one optical property of the electro-optical structure.

In one configuration, the control device can be formed in such a way that the electrical driving of the optoelectronic structure is formed in such a way that changing a voltage applied to the optoelectronic structure alters the first electromagnetic radiation in at least one wavelength range.

In one configuration, the optically active structure can be connected to a signal input of the control device in such a way that, by the measurement signal of the optically active structure, the electrical driving of the optoelectronic structure is altered from a first operating mode toward a second operating mode.

In one configuration, the coupling structure can be formed between the encapsulation structure and the electro-optical structure.

In one configuration, the optoelectronic component can be formed as a regulated lighting device, for example as a lighting device regulated with regard to the color valence of the emitted light.

In one configuration, the optoelectronic component can be formed as a lighting device, in particular as a surface light source.

In various embodiments, a method for producing an optoelectronic component is provided, the method including: forming an optoelectronic structure formed for providing a first electromagnetic radiation; and forming a measuring structure formed for measuring electromagnetic radiation, wherein forming the measuring structure includes forming an optically active structure and forming at least one electro-optical structure; wherein the optically active structure is formed for generating a measurement signal from an electromagnetic radiation taken up, and wherein the optically active structure is formed in a manner optically coupled to the optoelectronic structure; wherein the electro-optical structure is formed with regard to the optically active structure in such a way that the taken-up electromagnetic radiation of the optically active structure includes one of the following electromagnetic radiations: the first electromagnetic radiation, at least one second electromagnetic radiation of an external radiation source; or the first electromagnetic radiation and at least one second electromagnetic radiation of an external radiation source.

In one configuration of the method, the method may furthermore include forming a waveguide, wherein the waveguide is formed in such a way that, at least partly with regard to the electromagnetic radiation taken up in the optically active structure, said waveguide is formed at least partly as an optical connection for the optoelectronic structure to the optically active structure and/or for the optically active structure to the electro-optical structure. The waveguide can be formed in such a way that the optoelectronic structure, the optically active structure and/or the electro-optical structure are/is optically coupled to the waveguide at least partly with regard to the electromagnetic radiation taken up in the optically active structure.

In one configuration of the method, the waveguide can be formed as a planar waveguide.

In one configuration of the method, the optoelectronic structure can be formed in such a way that the optoelectronic structure includes at least one organic functional layer structure between a first electrode and a second electrode, wherein the organic functional layer structure includes at least one electroluminescent layer.

In one configuration of the method, forming the optoelectronic structure may include forming a plurality of organic functional partial structures.

In one configuration of the method, the plurality of organic functional partial structures can be formed in such a way that the plurality of organic functional partial structures include different emitter layers.

In one configuration of the method, the different emitter layers can be formed for emitting different first electromagnetic radiation.

In one configuration of the method, the plurality of organic functional partial structures can be formed alongside one another.

In one configuration of the method, the plurality of organic functional partial structures can be formed one above another.

In one configuration of the method, the plurality of organic functional partial structures may be formed in such a way that the plurality of organic functional partial structures, at least partly include different first electrodes and/or second electrodes.

In one configuration of the method, the optically active structure can be formed in a manner including at least one of the following optically active components or be formed in such a way: a photoconductor, a light emitting diode, an organic light emitting diode, a photodiode, an organic photodiode, a solar cell, and/or an organic solar cell.

In one configuration of the method, forming the optically active structure may include forming a single optically active component or be formed as such.

In one configuration of the method, the optically active structure can be formed in such a way that the optically active structure includes an organic functional layer structure including at least one electroluminescent layer.

In one configuration of the method, the optically active structure can be formed in such a way that the electroluminescent layer of the optically active structure includes the same substance or the same substance mixture as the electroluminescent layer of the optoelectronic structure.

In one configuration of the method, the optically active structure can be formed in such a way that the electroluminescent layer of the optically active structure includes the same substance or the same substance mixture as the electroluminescent layer of the optoelectronic structure.

In one configuration of the method, the optically active structure can be formed in such a way that the optically active structure and the optoelectronic structure are formed alongside one another in planar fashion.

In one configuration of the method, the optoelectronic component can be formed in such a way that the optoelectronic structure includes a first optically active region and the electro-optical structure includes a second optically active region, wherein the first optically active region is larger than the second optically active region.

In one configuration of the method, the optically active structure can be formed in the geometrical edge region of the optoelectronic structure.

In one configuration of the method, the method may furthermore include providing a carrier, wherein the optically active structure and the optoelectronic component are formed on or above the carrier.

In one configuration of the method, the carrier can be formed as a waveguide.

In one configuration of the method, the electro-optical structure can be formed in a manner including at least one of the following electro-optical components or be formed as such: a mirror having electrically tunable reflectivity; a filter having electrically tunable absorption; and/or a diaphragm having electrically tunable transmission.

In one configuration of the method, the electro-optical structure can be formed in such a way that the electro-optical structure includes a plurality of electro-optical components, wherein at least two electro-optical components are formed in such a way that the optically active structure is formed optically between the at least two electro-optical structures.

In one configuration of the method, the method may furthermore include forming an optical coupling structure, wherein the optical coupling structure is formed between the electro-optical structure and the waveguide.

In one configuration of the method, the optical coupling structure can be formed as a cohesive connection of electro-optical structure and waveguide, for example as an adhesive connection.

In one configuration of the method, the coupling structure can be formed in such a way that the coupling structure has a layer-thickness-averaged refractive index with an absolute value with regard to the electromagnetic radiation taken up in the optically active structure, such that the reflection of the electromagnetic radiation back into the waveguide is reduced.

In one configuration of the method, in which the waveguide and the optically active structure are formed an approximately identical refractive index, the coupling structure can have a refractive index like the waveguide or the optically active structure.

In one configuration of the method, in which the waveguide and the optically active structure are formed with a different refractive index, the coupling structure can have a refractive index that is between the refractive index of the waveguide and the refractive index of the optically active structure.

In one configuration of the method, the coupling structure can be formed in such a way that the coupling structure includes particles distributed in a matrix, wherein the particles have a refractive index difference with respect to the matrix with regard to the electromagnetic radiation taken up in the optically active structure, which difference is greater than 0.05.

In one configuration of the method, the particles can be formed in such a way that the particles are scattering with regard to the electromagnetic radiation taken up in the optically active structure, for example have an average diameter that is greater than 100 nm.

In one configuration of the method, the particles can be formed in such a way that the particles are non-scattering with regard to the electromagnetic radiation taken up in the optically active structure, for example have an average diameter that is less than 100 nm.

In one configuration of the method, the particles and/or the matrix can be formed from or include a thermotropic substance in such a way that the coupling structure has a scattering effect during the operation of the optoelectronic structure.

In one configuration of the method, the coupling structure can be formed as an optical cavity with regard to the electromagnetic radiation taken up in the optically active structure.

In one configuration of the method, the method may furthermore include forming an encapsulation structure, wherein the encapsulation structure is formed in such a way that the optically active structure and the optoelectronic structure are hermetically sealed with regard to indiffusion of water and/or oxygen.

In one configuration of the method, the electro-optical structure can be formed on or above the encapsulation structure.

In one configuration of the method, the electro-optical structure can be formed as a part of the encapsulation structure.

In one configuration of the method, forming the encapsulation structure may include providing the carrier and/or the waveguide, wherein the carrier and/or the waveguide are/is formed in hermetically impermeable fashion.

In one configuration of the method, forming the encapsulation structure may include forming a barrier layer, a cover and/or a cavity glass encapsulation.

In one configuration of the method, the method may furthermore include forming a control device, wherein the control device is formed for electrically driving the optoelectronic structure and/or the electro-optical structure.

In one configuration of the method, the control device can be formed in such a way that it controls an optical property of the electro-optical structure.

In one configuration of the method, the control device can be formed in such a way that the electrical driving of the electro-optical structure is formed in such a way that changing a voltage applied to the electro-optical structure alters at least one optical property of the electro-optical structure.

In one configuration of the method, the control device can be formed in such a way that the electrical driving of the optoelectronic structure is formed in such a way that changing a voltage applied to the optoelectronic structure alters the first electromagnetic radiation in at least one wavelength range.

In one configuration of the method, the optically active structure can be connected to a signal input of the control device in such a way that, by the measurement signal of the optically active structure, the electrical driving of the optoelectronic structure is altered from a first operating mode toward a second operating mode.

In one configuration of the method, the coupling structure can be formed between the encapsulation structure and the electro-optical structure.

In one configuration of the method, the optoelectronic component can be formed as a regulated lighting device, for example as a lighting device regulated with regard to the color valence of emitted light.

In one configuration of the method, the optoelectronic component can be formed as a lighting device, for example as a surface light source.

In various embodiments, a method for operating an optoelectronic component of one of the configurations described above is provided, the method including: determining a set of measurement signals of the measuring structure, and changing the driving of the optoelectronic structure from a first operating mode toward a second operating mode on account of the determined set of measurement signals; wherein determining the set of measurement signals includes electrically driving the electro-optical structure and/or the optoelectronic structure in such a way that the set of measurement signals includes measurement signals with respect to the following electromagnetic radiations: the first electromagnetic radiation, the at least one second electromagnetic radiation of an external radiation source; and the first electromagnetic radiation and the at least one second electromagnetic radiation of an external radiation source.

In one configuration of the method, the method may furthermore include determining the background signal of the optically active structure.

In one configuration of the method, determining the background signal may include: driving the electro-optical structure in such a way that no second electromagnetic radiation is incident on the optically active structure; and driving the optoelectronic structure in such a way that no first electromagnetic radiation is incident on the optically active structure.

In one configuration of the method, the optoelectronic component can be operated as a regulated lighting device.

In one configuration of the method, the optoelectronic component can be operated as a lighting device regulated with regard to the color valence of the first electromagnetic radiation.

In one configuration of the method, the ambient light of the optoelectronic component can be determined as second electromagnetic radiation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 2A and 2B show schematic cross-sectional views of optoelectronic component devices, in accordance with various embodiments;

FIGS. 3A and 3B show a schematic illustration for operating an optoelectronic component in accordance with various embodiments;

DETAILED DESCRIPTION

Figure 1:
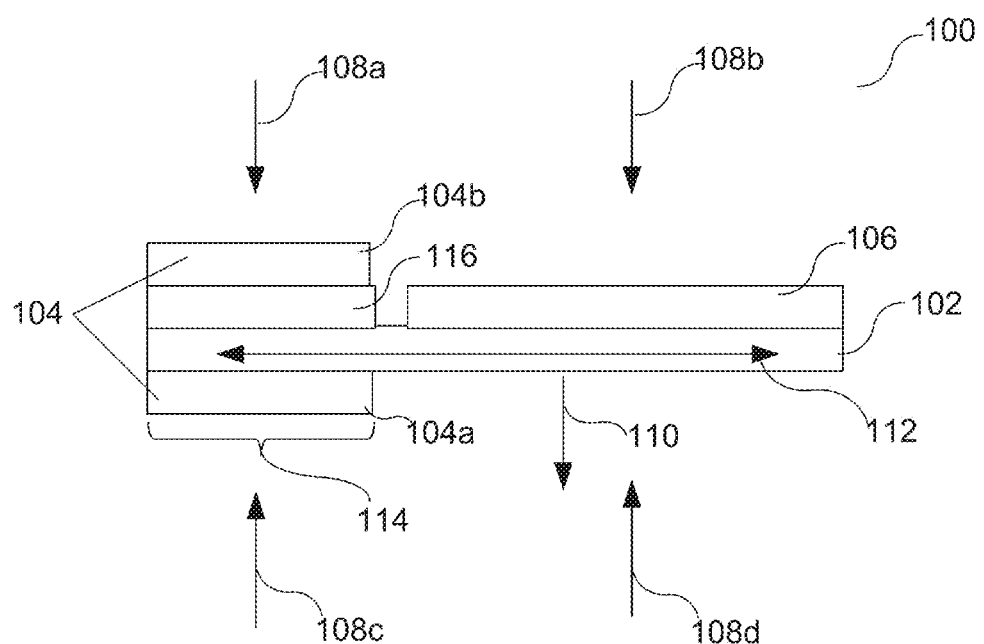
FIG. 1 shows a schematic cross-sectional view of an optoelectronic component in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Furthermore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components are described, wherein an optoelectronic component includes an optically active region. The optically active region can absorb electromagnetic radiation and form a photocurrent therefrom or emit electromagnetic radiation by a voltage applied to the optically active region. In various embodiments, the electromagnetic radiation can have a wavelength range including x-ray radiation, UV radiation (A-C), visible light and/or infrared radiation (A-C).

A planar optoelectronic component including two planar, optically active sides can be formed for example as transparent or translucent in the connection direction of the optically active sides, for example as a transparent or translucent organic light emitting diode.

However, the optically active region can also have a planar, optically active side and a planar, optically inactive side, for example an organic light emitting diode formed as a top emitter or a bottom emitter. The optically inactive side can be provided for example with a mirror structure and/or an opaque substance or substance mixture, for example for heat distribution; whereby the beam path of the optoelectronic component can be directed.

In the context of this description, providing electromagnetic radiation can be understood to mean emitting electromagnetic radiation. In other words, providing electromagnetic radiation can be understood as emitting electromagnetic radiation by a voltage applied to an optically active region.

In the context of this description, taking up electromagnetic radiation can be understood to mean absorbing electromagnetic radiation. In other words: taking up electromagnetic radiation can be understood to mean absorbing electromagnetic radiation and forming a photocurrent from the absorbed electromagnetic radiation.

In various configurations, an electromagnetic radiation emitting structure can be an electromagnetic radiation emitting semiconductor structure and/or be formed as an electromagnetic radiation emitting diode, as an organic electromagnetic radiation emitting diode, as an electromagnetic radiation emitting transistor or as an organic electromagnetic radiation emitting transistor. The radiation can be for example light (in the visible range), UV radiation and/or infrared radiation. In this context, the electromagnetic radiation emitting component can be formed for example as a light emitting diode (LED), as an organic light emitting diode (OLED), as a light emitting transistor or as an organic light emitting transistor. In various configurations, the electromagnetic radiation emitting component can be part of an integrated circuit. Furthermore, a plurality of electromagnetic radiation emitting components can be provided, for example in a manner accommodated in a common housing.

In various embodiments, an optoelectronic structure can be formed as an organic light-emitting diode (OLED), an organic field effect transistor (OFET) and/or an organic electronic system. The organic field effect transistor can be a so-called "all-OFET", in which all the layers are organic. An optoelectronic structure may include an organic functional layer system, which is synonymously also designated as organic functional layer structure. The organic functional layer structure may include or be formed from an organic substance or an organic substance mixture which is formed for example for providing an electromagnetic radiation from an electric current provided.

A "barrier layer" or a "barrier thin film" is a layer or a layer structure which is suitable for forming a barrier against chemical impurities or atmospheric substances, in particular against water (moisture) and oxygen. In other words, the barrier layer is formed in such a way that OLED-damaging substances such as water, oxygen or solvent cannot penetrate through it or at most very small proportions of said substances can penetrate through it.

A barrier layer can be formed as an individual layer or a plurality of partial layers formed one on top of another. In other words, in accordance with one configuration, the barrier layer can be formed as a layer stack.

In accordance with one configuration, the barrier layer one or a plurality of the partial layers of the barrier layer may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

In various embodiments, the barrier layer one or a plurality of the partial layers of the barrier layer may include one or a plurality of high refractive index substances, to put it another way one or a plurality of substances having a high refractive index, for example having a refractive index of at least 2.

The barrier layer or one or a plurality of partial layers of the barrier layer can be formed for example by a suitable deposition method, e.g. by a molecular layer deposition method (MLD), atomic layer deposition method (ALD) in accordance with one configuration, e.g. a plasma enhanced atomic layer deposition (PEALD) method or a plasmaless atomic layer deposition (PLALD) method, or by a chemical vapor deposition (CVD) method in accordance with another configuration, e.g. a plasma enhanced chemical vapor deposition (PECVD) method or a plasmaless chemical vapor deposition (PLCVD) method, or alternatively by other suitable deposition methods, for example cathode sputtering.

In various configurations, the barrier layer can be formed by an atomic layer deposition (ALD) method and/or a molecular layer deposition (MLD) method.

In accordance with one alternative configuration, in the case of a barrier layer including a plurality of partial layers, one or a plurality of partial layers of the barrier layer can be deposited by a different deposition method than an atomic layer deposition method, for example by a vapor deposition method, cathode sputtering and/or a combination of the methods.

In accordance with one configuration, in the case of a barrier layer including a plurality of partial layers, all the partial layers can be formed by an atomic layer deposition and/or a molecular layer deposition (MLD) method. A layer sequence including only ALD layers and/or MLD layers can also be designated as a "nanolaminate".

Furthermore, in various embodiments, the barrier layer can have a layer thickness in a range of approximately 0.1 nm (one atomic layer) to approximately 2000 nm, for example a layer thickness in a range of approximately 10 nm to approximately 200 nm, for example a layer thickness of approximately 40 nm.

In accordance with one configuration, in which the barrier layer has a plurality of partial layers, all the partial layers can have the same layer thickness.

In accordance with another configuration, the individual partial layers of the barrier layer can have different layer thicknesses. In other words, at least one of the partial layers can have a different layer thickness than one or more other partial layers.

In various configurations, the barrier layer may include two or more identical and/or different layers, or plies, for example alongside one another and/or one above another, for example as a barrier layer structure or a barrier stack, for example structured.

The connection of a first body to a second body can be positively locking, force locking and/or cohesive. The connections can be formed as releasable, i.e. reversible. In various configurations, connections can be formed as non-releasable, i.e. irreversible. A non-releasable connection can be separated only by the connection means being destroyed. In various configurations, an irreversible, close connection can be realized. In the case of a cohesive connection, the first body can be connected to the second body by atomic and/or molecular forces. Cohesive connections can often be non-releasable connections. In various configurations, a cohesive connection can be realized for example as an adhesively bonded connection, a soldered connection, for example of a glass solder, or of a metal solder, a welded connection.

In various configurations, an adhesive can be used for forming a cohesive connection. In various configurations, an adhesive may include or be formed from one of the following substances: a casein, a glutin, a starch, a cellulose, a resin, a tannin, a lignin, an organic substance including oxygen, nitrogen, chlorine and/or sulfur, a metal oxide, a silicate, a phosphate, a borate.

In various configurations, an adhesive may include or be formed from a hot melt adhesive, for example a solvent-containing wet adhesive, a contact adhesive, a dispersion adhesive, a water-based adhesive, a plastisol; a polymerization adhesive, for example a cyanacrylate adhesive, a methyl methacrylate adhesive, an anaerobically curing adhesive, an unsaturated polyester, a radiation-curing adhesive; a polycondensation adhesive, for example a phenol formaldehyde resin adhesive, a silicone, a silane-crosslinking polymer adhesive, a polyimide adhesive, a polysulfide adhesive; and/or a polyadditional adhesive, for example an epoxy resin adhesive, a polyurethane adhesive, a silicone, a pressure sensitive adhesive.

In various configurations, an adhesive layer may additionally include thermally conductive particles. The thermally conductive particles may include or be formed from one of the following substances: carbon nanotubes, diamond, copper, boron nitride, aluminum, aluminum nitride, and/or aluminum oxide. The thermal conductivity of the thermally conductive particles can be in a range of approximately 28 W/mK to approximately 1120 W/mK.

In various embodiments, a waveguide is a guide for guiding electromagnetic radiation. The waveguide is a component which is transmissive, for example transparent or translucent, for the electromagnetic radiation and which extends in at least one elongate extension direction. In this case, the light waveguiding takes place internally in the waveguide inter alia on account of internal reflection at an outer wall of the waveguide, which can also be designated as an interface, for example on account of total internal reflection on account of an angle of incidence of the electromagnetic radiation on the interface that is greater than the critical angle of total internal reflection, and wherein the waveguide has a refractive index that is greater than the refractive index of the material of the medium surrounding the waveguide or as a result of the reflective coating of the outer wall of the waveguide with a mirror structure. By way of example, the waveguide includes fibers, a tube or a rod which transport the electromagnetic radiation across a distance. The waveguide can also be designated as light guide, light guiding fiber, beam guide or optical fiber. The waveguide may include for example plastic, such as for example polymeric fibers, PMMA, polycarbonate and/or hard clad waveguide (hard clad silica). Furthermore, the waveguide can be formed as a planar waveguide (PLWL). A planar waveguide extends in a planar fashion in two spatial directions, such that the dimensions of the waveguide in said two spatial directions are larger than in the third spatial direction.

In various embodiments, a mirror structure can reflect electromagnetic radiation. In various embodiments, a mirror structure can be formed as an optical grating, a metallic mirror or mirror, a photonic crystal or a total internal reflection interface. A mirror structure can be formed as completely or partly reflective for electromagnetic radiation in a wavelength range, for example as a partly transmissive mirror structure, for example as a dichroic mirror. The partly transmissive mirror structure can be for example a splitter mirror and/or a one-way mirror. The partly transmissive mirror structure can for example reflect one part of the electromagnetic radiation incident on it and the other part of the incident electromagnetic radiation passes through the partly transmissive mirror structure. The partly transmissive mirror structure may include for example on one side a dielectric layer system and/or optionally on the other side a reflection-reducing coating, for example in order to avoid double images. As an alternative or in addition to the dielectric layer system, a very thin metal coating can also be used, for example.

FIG. 1 shows a schematic cross-sectional view of an optoelectronic component in accordance with various embodiments.

An optoelectronic component 100 may include in accordance with various embodiments: an optoelectronic structure 106 on or above a waveguide 102, wherein the optoelectronic structure 106 emits a first electromagnetic radiation 110, 112. The first electromagnetic radiation 110, 112 is partly guided in the transmissive waveguide 102—represented by the arrows 112; and partly emitted by the optoelectronic component 100—represented by the arrow 110.

The radiance of the electromagnetic radiation 112 guided in the waveguide 102 can be reduced by the lateral distance between the optically active structure 116 and the optoelectronic structure 106, for example since part of the electromagnetic radiation 112 is absorbed in the waveguide 102. A normalization of the electromagnetic radiation determined in the optically active structure 116 with regard to the emitted electromagnetic radiation 110 can be carried out as a result.

Furthermore, a functional coupling-out layer can be formed on the planar side of the waveguide 102, said planar side facing and/or facing away from the optoelectronic structure. Such a coupling-out layer can be a resist or a barrier layer, for example, wherein the refractive index of the coupling-out layer is matched in such a way that the total internal reflection in the waveguide 102 is reduced, i.e. the critical angle of total internal reflection is increased for the interface of the waveguide 102 by the coupling-out layer.

Furthermore, there is a measuring structure 114 including an optically active structure 116 and an electro-optical structure 104. The electro-optical structure 104 may include a first electro-optical component 104a and a second electro-optical component 104b. In the embodiment, the optically active structure 116 is optically coupled to the optoelectronic structure 106 by the waveguide 102. In other words: by the waveguide 102, the optically active structure 116 can take up at least one part of the first electromagnetic radiation 112. The optically active structure 116 is formed in such a way that the optically active structure 116 generates a measurement signal from an electromagnetic radiation taken up. A measurement signal of the optically active structure 116 can be for example an electrical voltage, an electric current and/or an electrical resistance value which is formed across/through/in the optically active structure 116 by the electromagnetic radiation taken up in the optically active structure 116.

A second electromagnetic radiation 108a-d is incident on the optoelectronic component 100, said second electromagnetic radiation being provided for example by an external radiation source (not illustrated). The measuring structure 114 is formed in such a way that in the optically active structure 116 the electromagnetic radiations 112, 108a and 108c can be measured individually. Electro-optical components 104a, b are formed in the beam paths (108a, c) of the second electromagnetic radiation 108 with the optically active structure 116. The electro-optical components 104a, b are formed in such a way that they have an electrically adjustable transmittance for the second electromagnetic radiation 108. As a result, the proportion of second electromagnetic radiation 108 and the directions from which the second electromagnetic radiation is incident simultaneously on the optically active structure 116 (top/bottom) can be adjusted by the electro-optical structure 104. In other words: by an optically active structure 116, for example a photodetector 116 or a sensor 116, between electro-optical components 104a, b, a separation of the external and internal electromagnetic radiations at the optically active structure 116 can be made possible. The electro-optical structure 104 may include, for example at least one electrically switchable mirror 104a, b. As a result, one optically active structure 116, for example a photodetector or a sensor, already suffices to determine the proportion of external electromagnetic radiation 108 and internal electromagnetic radiation 112. One electro-optical component 104a, b can suffice if external electromagnetic radiation 108 is incident on the optoelectronic component 100 only from one side of the optoelectronic component 100.

The external electromagnetic radiation 108 may include for example reflected, diffusely scattered electromagnetic radiation which was previously emitted (110) by the optoelectronic structure 106. The reflection of the emitted electromagnetic radiation 110 can take place for example from reflective external surfaces of the space in which the optoelectronic component is operated, for example walls. The external electromagnetic radiation 108 may furthermore include ambient light of the space, for example daylight. The proportion of the external electromagnetic radiation 108 that is constituted by the reflected radiation and the second electromagnetic radiation can be adjusted by the electro-optical structure 104. By way of example, the external radiation can be measured if the optoelectronic structure 106 emits no electromagnetic radiation 110. The proportion of reflected radiation in the external electromagnetic radiation 108 can be minimized as a result.

In the case of an optoelectronic structure 106 that emits on one side, the proportion of the external electromagnetic radiation 108 that is constituted by the reflected radiation, on the side of the optically active structure 116 which faces away from the optically active region 206 (see FIGS. 2A and 2B) of the optoelectronic structure 106, can be smaller than on the side of the optically active structure 116 which is parallel to the optically active region 206 of the optoelectronic structure 106.

In various embodiments, the optoelectronic structure 106 can be formed as a bottom emitter and/or as a top emitter. Furthermore, the optoelectronic structure 106 can be formed as transparent, translucent or opaque.

In various embodiments, the waveguide 102 can be formed as a common carrier 202 (FIGS. 2A and 2B) of the optically active structure 116 and of the optoelectronic structure 106. In other words: the optically active structure 116 and the optoelectronic structure 106 can be monolithically integrated. Forming an optoelectronic structure 106 which emits electromagnetic radiation and an optically active structure 116 which absorbs electromagnetic radiation on a common carrier 102 can also be referred to as a hybrid integration.

In various embodiments, the optically active structure 116 can be formed in accordance with one configuration of the optoelectronic structure 106, for example an organic functional layer structure between two electrodes, wherein the organic functional layer structure includes at least one emitter layer. The organic functional layer structure of the optically active structure 116 and of the optoelectronic structure 106 can be formed identically or differently.

In other words: in one embodiment, the optoelectronic component 100 has a hybrid/monolithic integration of a small separated surface region for the detection of an internal electromagnetic radiation and an external electromagnetic radiation alongside a radiation emitting component. The separated surface region can have the same layer construction as the radiation emitting component, but can be operated as a photodiode or photoconductor. By electrically switchable functional mirror elements, on the separated surface region it is possible to switch between the internal electromagnetic radiation and the external electromagnetic radiation.

Depending on the intensity of the incident electromagnetic radiation 108a-d or of the electromagnetic radiation 110, 112 emitted by the optoelectronic structure 106, a photovoltage or a change in resistance is generated at the optically active structure 116. Said photovoltage or change in resistance can be determined for example as a measurement signal of the optically active structure 116. The measurement signal turns out to be all the higher in terms of absolute value, the higher the incident radiation intensity, for example the higher the light intensity. This measurement signal can be processed in an electronic circuit (external, hybrid) and can be used as a control signal for the optoelectronic structure 106. As a result, it is possible to keep constant for example the luminous intensity of the electromagnetic radiation 110 emitted by the optoelectronic component 100 at the location of the optically active structure 116.

The dimensioning of the optically active region 236 of the optically active structure 116 can be adapted in such a way that upon measurement of the electromagnetic radiation with optoelectronic structure 106 switched on and/or switched off, a sufficiently stable measurement signal with a high signal-to-noise ratio can be determined, without generating an instability of the optically active structure 116 for example on account of unstable feedback. When determining the measurement signal with the optoelectronic structure 106 switched off, it is possible to determine the dark current of the optoelectronic component. By coordinated driving of the electro-optical components 104a, b fitted on the surface region at front side and rear side of the optically active structure 116, the optically active structure 116 can detect either internal electromagnetic radiation 112, external electromagnetic radiation 108a-d or both electromagnetic radiations 108a-d, 112 together. The proportion and the direction of the external electromagnetic radiation 108a-d can be adjusted by the transmittance of the electro-optical components 104a, b. In the case of color-controllable optoelectronic structures 106, it is possible in this way to use three individual optically active structures 116 which, via the spectral characteristic of the electro-optical components 104a, b, are formed as sensitive to the red, green and blue spectral range, for example.

FIGS. 2A and 2B show schematic cross-sectional views of optoelectronic component devices, in accordance with various embodiments.

Various embodiments of an optoelectronic component 100 in accordance with a configuration from the description above are described below.

For the case where, for example, a light emitting monochromatic or emission spectrum-limited optoelectronic component 100 is intended to be provided, it suffices for the optoelectronic structure 106 to be translucent at least in a partial range of the wavelength range of the desired monochromatic light or for the limited emission spectrum. An optoelectronic structure 106 which is formed as at least partly transmissive, for example transparent or translucent, can have two planar, optically active sides—in the schematic cross-sectional view the top side and the underside of the optoelectronic structure 106. The optically active region 206 of the optoelectronic structure 106 can, however, also have only one optically active side and an optically inactive side, for example in the case of an optoelectronic component 106 formed as a top emitter or a bottom emitter, for example by the formation, on one side, of an opaque, nontransmissive structure for provided electromagnetic radiation in the beam path of the side of the optoelectronic structure which is intended to be optically inactive.

The optoelectronic structure 106 and the optically active structure 116 can be formed on or above a common carrier 202.

In the case of an optoelectronic component 100 including an optoelectronic structure 106 formed as a top emitter, the carrier 202 can be formed in opaque fashion.

The carrier 202 can be formed for example as transmissive with regard to the provided electromagnetic radiation 110, 112 (FIG. 1) of the optoelectronic component 100 and/or a second electromagnetic radiation of an external radiation source.

The carrier 202 can be formed from a transparent or translucent glass or plastic, for example. As a result, the carrier 202 can be used as a waveguide 102 for the optoelectronic structure 106 and the optically active structure 116. The optoelectronic structure 106 and the optically active structure 116 can have optically active regions 206, 236 which are optically coupled to the waveguide 102, for example the carrier 202.

The carrier 202 can serve for example as a carrier element for electronic elements or layers, for example light emitting elements. By way of example, the carrier 202 may include or be formed from glass, quartz and/or a semiconductor material. Furthermore, the carrier 202 may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 202 may include or be formed from a metal, for example copper, silver, gold, platinum, iron, for example a metal compound, for example steel.

A carrier 202 including a metal or a metal compound can also be formed as a metal film or a metal-coated film. The carrier 202 may include one or a plurality of the abovementioned substances.

The carrier 202 can be embodied as translucent or even transparent.

In the case of a carrier 202 which includes a metal or is formed in opaque fashion, the metal can be formed for example as a thin transparent or translucent layer and/or the metal can be a part of a mirror structure. Furthermore, a waveguide 102 can be formed between the carrier 202 and the optically active structure 116 and optoelectronic structure 106, such that the optically active structure 116 and the optoelectronic structure 106 are optically coupled to one another.

The carrier 202 can have a mechanically rigid region and/or a mechanically flexible region or be formed in this way. A carrier 202 having a mechanically rigid region and a mechanically flexible region can for example be structured, for example by the rigid region and the flexible region having a different thickness.

A mechanically flexible carrier 202 or the mechanically flexible region can be formed for example as a film, for example a plastics film, metal film or a thin glass.

The electrically active region of the optoelectronic structure 106 is formed on or above the carrier 202. The electrically active region can be understood as that region of the optoelectronic structure 106 in which an electric current flows for the operation of the optoelectronic structure 106. In various embodiments, the electrically active region may include the first electrode 210, the second electrode 214 and the organic functional layer structure 212, as will be explained in even greater detail below.

A barrier layer 230 can optionally be arranged on or above the carrier 202, for example on the side of the organic functional layer structure 212 and/or on the side which faces away from the organic functional layer structure 212 (illustrated). The coupling-out layer 230 can also be designed as barrier layer 230.

The coupling-in/out layer may include a matrix and scattering centers distributed therein, wherein the layer-thickness-averaged refractive index of the coupling-in/out layer is greater than that layer-thickness-averaged refractive index of the optoelectronic structure 102.

A further cover (not illustrated) can be provided on or above the barrier layer 230 and/or the barrier layer 230 can be formed as a further cover, for example as a cavity glass encapsulation.

The first electrode 210 is formed on or above the carrier 202.

The first electrode 210 can be formed as an anode, that is to say as a hole-injecting electrode, or as a cathode, that is to say as an electron-injecting electrode.

The first electrode 210 can have or be electrically connected to a first electrical contact pad 208, to which a first electrical potential can be applied. A contact pad can also be designated as a contact region at which formation of an electrical connection is possible. The first electrical potential can be for example the ground potential or some other predefined reference potential. The first electrical potential can be provided by an energy source (see FIG. 3A), for example a current source or a voltage source.

Alternatively, the first electrical potential can be applied to the carrier 202 if the latter is formed in electrically conductive fashion, and then be applied indirectly to the first electrode 210 via said carrier.

In various embodiments, the first electrode 210 and the carrier 202 can be formed as translucent or transparent.

The first electrode 210 can be formed from an electrically conductive substance, such as, for example, from a metal or a transparent conductive oxide (TCO) or a layer stack including a plurality of layers of the same metal or different metals and/or the same TCO or different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 210 may include a metal; for example Ag, Pt, Au, Mg, Al, Ba, In, Cr, Mo, Ca, Sm, Ni, Nb or Li, and compounds, combinations or alloys of these substances.

In various embodiments, the first electrode 210 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 210 may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires.

Furthermore, the first electrode 210 may include electrically conductive polymers or transition metal oxides or transparent electrically conductive oxides.

In the case where the first electrode 210 includes or is formed from a metal, the first electrode 210 can have for example a layer thickness of less than or equal to approximately 25 nm, for example a layer thickness of less than or equal to approximately 20 nm, for example a layer thickness of less than or equal to approximately 18 nm. Furthermore, the first electrode 210 can have for example a layer thickness of greater than or equal to approximately 10 nm, for example a layer thickness of greater than or equal to approximately 15 nm. In various embodiments, the first electrode 210 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 210 includes or is formed from a transparent conductive oxide (TCO), the first electrode 210 can have for example a layer thickness in a range of approximately 20 nm to approximately 200 nm, for example a layer thickness in a range of approximately 75 nm to approximately 250 nm, for example a layer thickness in a range of approximately 100 nm to approximately 150 nm.

Furthermore, for the case where the first electrode 210 are formed from, for example, a network composed of metallic nanowires, for example composed of Ag, which can be combined with conductive polymers, a network composed of carbon nanotubes which can be combined with conductive polymers, or from graphene layers and composites, the first electrode 210 can have for example a layer thickness in a range of approximately 1 nm to approximately 2000 nm, for example a layer thickness in a range of approximately 10 nm to approximately 400 nm, for example a layer thickness in a range of approximately 40 nm to approximately 250 nm. The first electrode 210 can be physically and electrically connected to an electrical connection layer 222.

The electrical connection layer 222 can be formed on or above the carrier 202 in the geometrical edge region of the optically active region 206 of the optoelectronic structure 106, for example laterally alongside the first electrode 210.

The electrical connection layer 222 can shift the electrical connection of the first electrode 210 into the geometrical edge region of the optoelectronic component to a contact pad 232 (not illustrated).

In one embodiment, the electrical connection layer 222 can be formed as optically transparent, translucent or opaque.

The electrical connection layer 222 may include or be formed from, as substance or substance mixture, a substance or a substance mixture in accordance with one of the configurations of the electrodes 210, 214.

An organic functional layer structure 212 is formed on or above the first electrode 210.

In various embodiments, the organic functional layer structure 212 can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 200 nm, for example a layer thickness of a maximum of approximately 400 nm, for example a layer thickness of a maximum of approximately 300 nm.

In various embodiments, the organic functional layer structure 212 may include a stack of a plurality of organic functional partial structures arranged directly one above another.

The organic functional partial structures can be separated from one another for example by a charge generating layer (CGL) structure.

Each organic functional partial structure can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 200 nm, for example a layer thickness of a maximum of approximately 400 nm, for example a layer thickness of a maximum of approximately 300 nm.

The organic functional layer structure 212 may include for example a stack of two, three, or four organic functional partial structures arranged directly one above another, in which case for example the organic functional layer structure 212 can have a layer thickness of a maximum of approximately 3 µm.

The organic functional layer structure 212 or an organic functional partial structure may include one or a plurality of hole-conducting layer(s).

A hole-conducting layer can also be designated as a hole transport layer or electron blocking layer.

The hole transport layer can be formed, for example deposited, on or above the first electrode 210.

The emitter layer can be formed, for example deposited, on or above the hole transport layer.

The organic functional layer structure 212 or an organic functional partial structure may include one or a plurality of emitter layers (not illustrated). An emitter layer can also be designated as an electroluminescent layer.

An emitting layer may include or be formed from a fluorescent and/or phosphorescent material, for example.

In the case of an emitter layer which includes a fluorescent or phosphorescent emitter material, the emitter material can be embedded, for example distributed or dissolved, in a matrix material.

The emitter materials of the emitter layer(s) of the optoelectronic structure 106 can be selected for example such that the optoelectronic structure 106 emits white light.

The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer.

By mixing the different colors, the emission of light having a white color impression can result. Alternatively, provision can also be made for arranging a wavelength-converting material in the beam path of the primary emission generated by said layers, which wavelength-converting material at least partly absorbs the primary radiation and emits a secondary radiation having a different wavelength, such that a white color impression results from a (not yet white) primary radiation by virtue of the combination of primary radiation and secondary radiation.

The one or the plurality of electroluminescent layers may include organic polymers, organic oligomers, organic monomers, organic small, non-polymeric molecules ("small molecules") or a combination of these materials. Polymer emitters can be formed as an emitter layer for example by a wet-chemical method, for example by a spin coating method.

Examples of emitter materials which can be used in the optoelectronic structure 106 in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by thermal evaporation, an atomic layer deposition method and/or a molecular layer deposition method.

In various embodiments, the organic functional layer structure 212 may include one or a plurality of electroluminescent layers formed as a hole transport layer, so as to enable for example an effective hole injection into an electroluminescent layer or an electroluminescent region.

The organic functional layer structure 212 or an organic functional partial structure may include one or a plurality of electron-conducting layers.

The electron transport layer can be formed, for example deposited, on or above the emitter layer.

An electron-conducting layer can also be designated as an electron transport layer or hole blocking layer.

As a result, an effective electron injection into an electroluminescent layer or an electroluminescent region can be made possible in the optoelectronic structure 106.

By way of example, tertiary amines, carbazole derivatives, conductive polyaniline or polyethylene dioxythiophene can be used as substance for the hole transport layer.

A second electrode 214 can be formed on or above the organic functional layer structure 212 or, if appropriate, on or above the one or the plurality of further organic functional layer structures.

The second electrode 214 can be formed in accordance with one of the configurations of the first electrode 210.

The second electrode 214 can be formed as an anode, that is to say as a hole-injecting electrode, or as a cathode, that is to say as an electron-injecting electrode.

In various embodiments, the first electrode 210 and second electrode 214 are both formed as translucent or transparent.

A second electrical potential can be applied to the second electrode 214. The second electrical potential is different than the first electrical potential. The second electrical potential can be provided by the same energy source as the first electrical potential (see FIG. 3A).

The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second electrode 214 can be physically and electrically connected to an electrical contact pad 232.

In the geometrical edge region of the optoelectronic component 100, the optoelectronic structure 106 can be formed in such a way that contact pads 232 for electrically contacting the optoelectronic structure 106 are formed, for example by virtue of electrically conductive layers, for example electrical connection layers 222, electrodes 210, 214 or contact pads 232, being at least partly exposed in the edge region of the optoelectronic component 100.

The contact pads 232 may include or be formed from, as substance or substance mixture, a substance or a substance mixture of one of the configurations of the first electrode 210 and/or of the second electrode 214, for example as a metal layer structure including at least one chromium layer and at least one aluminum layer, for example chromium-aluminum-chromium (Cr—Al—Cr); or molybdenum-aluminum-molybdenum (Mo—Al—Mo), silver-magnesium (Ag—Mg), aluminum, Cr—Al—Mo, Cr—Al—Ni/Nb.

The contact pads 232 may include for example a contact area, a pin, a flexible circuit board, a terminal, a clip or some other electrical connection means, or be formed in this way.

In one embodiment, the contact pads 232 can be formed as optically transparent, translucent or opaque.

The second electrode 214 is electrically insulated from the first electrode 210 by an electrical insulation 204. The electrical connection layer 222 is electrically insulated from the second electrode 214 by a further electrical insulation 204.

However, an electrical insulation 204 can also be optional, for example when forming the optoelectronic structure 106 with a suitable mask process.

In one embodiment, the electrical insulation 204 can be formed as optically transparent, translucent or opaque.

The electrical insulations 204 can be formed in such a way that a current flow between the first electrode 210 and the second electrode 214 is prevented.

The substance or the substance mixture of the electrical insulation can be for example a covering or a coating agent, for example a polymer and/or a lacquer. The lacquer may include for example a coating substance that can be applied in liquid form or in pulverulent form, for example may include or be formed from a polyimide.

The electrical insulations 204 can be applied or formed for example lithographically or by a printing method, for example in a structured fashion. The printing method may include for example inkjet printing, screen printing and/or pad printing.

A barrier layer 208 can be arranged on or above the second electrode 214 in such a way that the second electrode 214, the electrical insulations 204 and the organic functional layer structure 212 are surrounded by the barrier layer 208, i.e. are enclosed in the connection of the barrier layer 208 to the carrier 202.

Furthermore, it should be pointed out that, in various embodiments, a barrier layer 208 can also be completely dispensed with. In such a configuration, the optoelectronic component may include a further encapsulation structure, for example, as a result of which a barrier layer 208 can become optional, for example a cover, for example a cavity glass encapsulation or metallic encapsulation.

The barrier layer or the individual partial layers of the barrier layer can be formed as translucent or transparent layer. In other words, the barrier layer can be formed as translucent or transparent.

An adhesive layer 224 or adhesion layer 224 is arranged on or above the electrically active region, for example on or above the barrier layer 208, in such a way that the adhesion layer 224 seals the electrically active region areally and hermetically with respect to harmful environmental influences, for example reduces the diffusion rate of water and/or oxygen toward the barrier layer 208.

The adhesion layer 224 can be formed as translucent and/or transparent.

The adhesion layer 224 can have a layer thickness of greater than approximately 1 µm, for example a layer thickness of a plurality of µm.

The adhesion layer 224 may include or be a lamination adhesive, for example.

The adhesion layer 224 can have a refractive index that is less than the refractive index of the cover 226. Such an adhesion layer 224 may include for example a low refractive index adhesive, for example an acrylate, which has a refractive index of approximately 1.3.

However, the adhesion layer 224 may also include a high refractive index adhesive, which includes high refractive index, non-scattering particles, for example, and has an average refractive index corresponding approximately to the average refractive index of the organic functional layer structure, for example in a range of approximately 1.7 to approximately 2.0 or greater.

Furthermore, a plurality of different adhesives can be provided in the adhesion layer 224, said adhesives forming an adhesive layer sequence, for example a second adhesion layer.

Scattering particles with regard to the internal and/or external electromagnetic radiation can also be embedded into the adhesion layer 224. The particles can lead to a further improvement in the color angle distortion and the coupling-out efficiency.

In various embodiments, the scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 214 and the adhesion layer 224, an electrically insulating layer (not shown) can also be applied, for example SiN, $SiO_x$, $SiNO_x$ for example having a layer thickness in a range of approximately 300 nm to approximately 1.5 µm, for example having a layer thickness in a range of approximately 200 nm to approximately 1 µm, in order to protect electrically unstable materials, during a wet-chemical process for example.

A getter layer can be arranged (not illustrated) on or above the electrically active region, for example at least partly on or above the optically active region 206 and/or at least partly on or above the optically inactive region. The getter layer can be embedded in the adhesion layer 224, for example, in such a way that the getter layer has no surface interface with air. As a result, the getter layer can hermetically seal the electrically active region with respect to harmful environment influences, for example reduce the diffusion rate of water and/or oxygen toward the barrier layer 208 and/or the electrically active region.

The optically active region 206 can be at least partly free of a getter layer, for example if the getter layer is formed in opaque fashion and the optically active region 206 is formed as transparent and/or translucent. Furthermore, the optically active region 206 can be at least partly free of a getter layer in order to save getter layer.

Furthermore, the getter layer can be formed in accordance with one of the configurations of the adhesion layer 224.

A cover 226 is at least partly arranged on or above the adhesion layer 224.

The cover 226 can be adhesively bonded, for example laminated, onto or above the barrier layer 208 by the adhesion layer 124, for example.

The cover 226 can be formed for example as a glass cover, a metal cover and/or plastics cover.

The cover 226 can for example be structured, for example as a cavity glass.

The barrier layer 208 and/or the cover 226 can be formed in such a way that the enclosed layers are hermetically sealed with respect to harmful environmental influences, for example with regard to water and/or oxygen.

In one configuration, the cover 226, for example composed of glass, can be applied for example by frit bonding (glass frit bonding/glass soldering/seal glass bonding) to the barrier layer 208 by a conventional glass solder in the geometrical edge regions of the optoelectronic component 100.

In various embodiments, the cover 226 and/or the adhesion layer 224 can have a refractive index (for example at a wavelength of 633 nm) of 1.55.

Besides the optoelectronic structures 106, an optically active structure 116 is formed on or above the carrier 202. An optically active structure 116 may include an optically active region 236 and be formed for example as a photodiode 116 or a photoconductor 116.

The optically active region 236 of the optically active structure 116 can have an area in a range of approximately 0.5 $cm^2$ to approximately 250 $cm^2$, for example greater than approximately 1 $cm^2$.

In various embodiments, electromagnetic radiation 112 provided by the optoelectronic structure 106 is coupled through the waveguide 102, for example the transmissive carrier 202, into the optically active region 206 of the optically active structure 116.

In one embodiment (FIG. 2A), the optically active structure 116 can be formed in accordance with one of the configurations of the optoelectronic structure 106, for example as an organic photodiode. An optoelectronic structure can be operated as an optically active structure by the optoelectronic structure being operated in the reverse direction.

In one embodiment, with the surface conductance of the organic functional layer structure being low, the optically active structure 116 and the optoelectronic structure 106 can be formed by at least one of the electrodes being laterally structured in such a way that two separated, electrically insulated electrodes are formed, for example by a trench structure being formed in one of the electrodes. In other words, the other layers of the optically active structure 116 and of the optoelectronic structure 106 can be identical. However, apart from one of the electrodes, it is also possible to separate further layers in the trench structure.

In one embodiment (FIG. 2B), the optically active structure 116 can be formed as a photoconductor 234, in which the electrical resistance or the electrical conductance can be changed by an incident electromagnetic radiation. In other words: the optically active structure 116 may include or be formed from a substance whose electrical resistance or electrical conductivity changes with the luminance of the incident electromagnetic radiation.

The photoconductor 234 can have two or more electrical contacts 228 having a polarity, for example electron-conducting or hole-conducting.

The photoconductor 234 may include or be formed from a material which can absorb electromagnetic radiation 108, 112 and forms a readable measurement signal therefrom. A readable measurement signal can be for example the change in an electrical resistance, an electrical conductivity, an inductance, an electrical capacitance or a fluorescence.

The photoconductor 234 may include the same material as, or a different material than, the optoelectronic structure.

By the barrier layer 208, the adhesion layer 224 and/or the cover 226 on or above the optically active structure 116 and the optoelectronic structure 106, these can be encapsulated. It is thereby possible to realize a monolithic integration of optically active structure 116 and optoelectronic structure 106 on a common carrier 202.

The optoelectronic structure 106 can be electrically insulated from the optically active structure 116, for example by the optically active structure 116 having a third electrode 216 and a fourth electrode 220.

In various configurations, the waveguide 102 can be formed as a cover 226 and/or carrier 202 of the optically active structure 116 and the optoelectronic structure 106.

In various configurations, the optoelectronic structure 106 and/or the optically active structure 116 can be optically connected to the waveguide 102 by an optical coupling structure, for example in accordance with one of the configurations of the barrier layer 208 or the adhesion layer 224.

In various configurations, the coupling-out layer 230 can be formed or structured in such a way that the coupling-out layer 230 increases a coupling-out of electromagnetic radiation 110 from the waveguide 102 only in the optically active region 206 of the optoelectronic structure 106, for example by virtue of the waveguide 102 and/or the carrier 202 in the optically active region 236 of the optically active structure 116 being free of coupling-out layer 230.

The electro-optical structure 104 may include one or a plurality of electro-optical components 104a, b.

An electro-optical component 104a, b can be formed as a colored, matt, silvery and/or diffuse structure whose transmittance is electrically adjustable. The transmittance can be adjusted by a change in the reflectivity and/or the absorption of the electro-optical component 104a, b.

In various embodiments, an electro-optical component 104a, b can be formed as an electrically switchable mirror having tunable reflectivity. In various embodiments, the reflectivity can be tuned in an electrochromic-electrical, gasochromic or thermochromic manner. An electrically switchable mirror having tunable reflectivity can be formed in the manner as described for example in DE10031294A1; DE102007022090A1.

An electrically switchable diaphragm having tunable transmission or an electrically switchable filter having tunable absorption can be formed in a manner as described for example in J. Jacobsen et al., IBM System Journal 36 (1997) 457-463; B. Comiskey et al. Nature 394 (1998) 253-255; WO199803896A1; WO199841899A1; WO2010064165A1; WO2009053890A2; EP1601030A2.

The electro-optical component 104a, b can be formed in such a way that, by applying a control signal to the electro-optical component 104a, b, the optical properties of the electro-optical component 104a, b are altered, for example the transmission, the absorption and/or the reflection of electromagnetic radiation by/in/from the electro-optical component 104a, b. A control signal can be for example the change in a voltage applied to the electro-optical component 104a, b or a change in the current intensity through the electro-optical component 104a, b. The optical properties of the transmitting component can be altered for example in a range of from 0% (no change) to 100% (complete change). Changing the transmitting electromagnetic radiation can also be changing the direction of polarization of the transmitting electromagnetic radiation, for example for the case where the optically active structure has at least one preferred direction of the polarization with regard to taking up electromagnetic radiation.

An electro-optical component 104a, b can be formed in such a way that the optical properties of the electro-optical component change abruptly, i.e. instantaneously, discretely, discontinuously; with a control signal being applied to the electro-optical component 104a, b. However, an electro-optical component 104a, b can also be formed in such a way that the optical properties of the electro-optical component change continuously, i.e. fluidly, steadily; with a control signal being applied to the electro-optical component.

In various embodiments, an electro-optical component 104a, b can be formed as a film and be applied on or above the optically active structure 116, for example by adhesive bonding, for example using an adhesive or an adhesion layer in accordance with one of the configurations described above. In one embodiment, the adhesive used for adhesively bonding an electro-optical component 104a, b can additionally be formed as a coupling-out layer (see above).

FIGS. 3A and 3B show a schematic illustration for operating an optoelectronic component in accordance with various embodiments.

The optoelectronic component 100 (FIG. 3A) in accordance with one of the configuration described above can be connected to an external energy source by a control device 302—illustrated as connections 304 in FIG. 3A.

The optoelectronic structure 106 (illustrated by the connection 306 in FIG. 3A) and the measuring structure 114 can be electrically connected to the control device 302. In the case of the measuring structure 114, the optically active structure 116 (illustrated by the connection 312 in FIG. 3A) and the electro-optical components 104a, b (illustrated by the connection 308, 310 in FIG. 3A) of the electro-optical structure 104 can be electrically connected to the control device 302.

The control device 302 can be formed in such a way that the optoelectronic structure 106 and the electro-optical structure 104 are supplied with an electrical voltage or an electric current. As a result, the transmittance can be adjusted in the case of the electro-optical structure 104 and one or a plurality of optical property(-ies) of the electromagnetic radiation 110 provided can be adjusted in the case of the optoelectronic structure 106. The control device 302 can be formed in such a way that the optoelectronic structure 106 can be driven independently of the electro-optical structure 104.

An adjustable optical property can be for example the polarization, the intensity, the color locus, the color valence, the brightness, the saturation, the color or the emission characteristic. For changing one optical property, it may be necessary to change a plurality of other optical properties, for example when changing the color valence.

The optically active structure 116 can be connected to the signal input of the control device 302. The electromagnetic radiation 112, 108a, c taken up by the optically active structure 116 can generate an electrical voltage across the electrodes 216, 220. Said voltage can be communicated as measurement signal to the control device 302 as input signal, for example in an amplified fashion. As a result, depending on the determined measurement signal of the optically active structure 116, the operating mode of the optoelectronic structure 106 and of the electro-optical structure 104 can be altered from a first operating mode toward a second operating mode. Altering the operating mode can have the effect, for example, that an adjustable optical property of the electromagnetic radiation 110 provided is altered toward an optical target property. Changing an adjustable optical property in such a way can be for example changing the color locus of an electromagnetic radiation 110 provided in the diurnal course of the sun in the room in which the optoelectronic component is operated.

The reason for changing the transmittance of the electro-optical structure 104 can be dependent on the configuration of the electro-optical structure 104, for example changing an electric field in the electro-optical component.

In the case of a plurality of optoelectronic components in a room, the control device may include a device which reduces feedback of diffusely reflected electromagnetic radiation in the measurement signal of the external electromagnetic radiation.

For clarifying the operation of the measuring structure 114, it is assumed that the optoelectronic structure 106 of a transparent optoelectronic component 100 is operated in a constant-current mode and the electro-optical structure 104 includes two electrically switchable mirrors 104a, b. The electrically switchable mirrors 104a, b can be driven for example by pulse amplitude modulation (PAM), pulse width modulation (PWM) and/or pulse frequency modulation (PFM). In the case of a high reflectivity 320 of the electrically switchable mirrors 104a, b the transmittance for electromagnetic radiation through the mirror is low. An electrically switchable mirror having a high reflectivity can be specularly reflective, for example, and an electrically switchable mirror having a low reflectivity can be translucent, for example. In the case of an electro-optical structure 104 including two or more electro-optical components 104a, b, the electro-optical components 104a, b can be driven identically or differently (FIG. 3B).

FIG. 3B is intended to serve for clarifying the reflectivity 320 of two electrically switchable mirrors 104a, b at different times 322. For controlling the radiance of the electromagnetic radiation 110 provided, a measurement cycle can be carried out at the optically active structure 116 at regular intervals. A measurement cycle may include a plurality of operating modes of the electrically switchable mirrors. In the case of discrete settings of the transmittance of the electrically switchable mirrors 104a, b, different operating modes 324, 326, 328, 330 are possible, which are described below.

In the case of a first operating mode 324, both electrically switchable mirrors 104a, b of the electro-optical structure 114 can have a high reflectivity. As a result, the transmittance for external electromagnetic radiation to the optically active structure 116 is minimal in the first operating mode 324. As a result, the internal electromagnetic radiation 112 can be determined by the optically active structure 116. In the case of a comparison of the determined measurement signal of the optically active structure 116 with older measurement signals, the aging of the optoelectronic structure 106 can be determined. The older measurement signals can be stored for example in an electronic memory of the control device 302. By way of example, the brightness can decrease upon ageing of the optoelectronic structure 106. By increasing the operating voltage or the operating current of the optoelectronic structure 106 on account of the determined ageing of the optoelectronic structure 106, it is possible for the optical properties to be kept approximately constant during the operation of the optoelectronic component 100.

In the case of the second operating mode 326, the first electrically switchable mirror 104a can have a high reflectivity and the second electrically switchable mirror 104b can have a low reflectivity. In the case of the second operating mode 326, for example, the electromagnetic radiation taken up in the optically active structure 116 can be determined, said electromagnetic radiation including the electromagnetic radiation 108c incident on the optically active structure 116 from below and the internal electromagnetic radiation 112. By an evaluation of the determined measurement signal in the first operating mode 324 and the determined measurement signal in the second operating mode 326, for example, it is possible to determine the radiance of the external electromagnetic radiation 108c from below. This can then be used for regulating the optical properties of the optoelectronic structure 106. By way of example, in the case of a high radiance of the external electromagnetic radiation 108, the radiance of the electromagnetic radiation 110 provided can be reduced.

The electromagnetic radiation 110 provided can be reduced for example by the control device 302 reducing the operating current or the operating voltage of the optoelectronic structure 106.

In the case of the third operating mode 328, the second electrically switchable mirror 104b can have a high reflectivity and the first electrically switchable mirror 104a can have a low reflectivity. In the case of the third operating mode 328, for example, the electromagnetic radiation taken up in the optically active structure 116 can be determined, said electromagnetic radiation including the electromagnetic radiation 108a incident on the optically active structure 116 from above and the internal electromagnetic radiation 112. By an evaluation of the determined measurement signal in the first operating mode 324 and the determined measurement signal in the third operating mode 328, for example, it is possible to determine the radiance of the external electromagnetic radiation 108a from above. This can then be used for regulating the optical properties of the optoelectronic structure 106. By way of example, in the case of a high radiance of the external electromagnetic radiation 108, the radiance of the electromagnetic radiation 110 provided can be reduced.

In the case of a fourth operating mode 330, both electrically switchable mirrors 104a, b can have a low reflectivity. In the case of the fourth operating mode 330, by way of example, the electromagnetic radiation taken up in the optically active structure 116 can be determined, said electromagnetic radiation including the electromagnetic radiation 108a, c incident on the optically active structure 116 externally and the internal electromagnetic radiation 112. The fourth measurement can be used as a check measurement for the abovementioned operating modes 324, 326, 328.

Furthermore, the operating modes 324, 326, 328, 330 described can be carried out in the case of an optically inactive optoelectronic structure 106.

In the case of the first operating mode with an optically inactive optoelectronic structure 106, it is thereby possible to determine the dark current or the background signal of the optoelectronic component 100.

In the case of the second operating mode and third operating mode with an optically inactive optoelectronic structure 106, it is possible to determine the proportions of the external electromagnetic radiation which are incident on the optically active structure 116 from above and below.

In the case of the fourth operating mode with an optically inactive optoelectronic structure 106, it is possible to determine the dark current or the background signal of the room in which the optoelectronic component 100 is operated.

From the measurement in the first operating mode 324, in the second operating mode 326 or in the third operating mode 328 with optically active optoelectronic structure 106 and optically inactive optoelectronic structure 106, it is possible to determine that proportion of electromagnetic radiation 110 provided which, as a result of diffuse reflection in the room in which the optoelectronic component 100 is operated, is part of the external electromagnetic radiation 108. The optical properties of the room in which the optoelectronic component 100 is operated can be determined as a result. By way of example, during the operation of a complex lighting device including a plurality of optoelectronic components in a room, this information can then be used for optimizing the illumination of the room.

When the optoelectronic component 100 is used in a room having temporary sunlight, by the control device 304 an operating mode of the optoelectronic component can be set in such a way that, with sufficient sunlight, the electromagnetic radiation 110 provided by an optoelectronic component 100 is automatically reduced. If the measuring structure determines darkness, for example at night, the control device 302 can drive the optoelectronic structure 106 in such a way that the optoelectronic component 100 illuminates the room.

Figure 4:
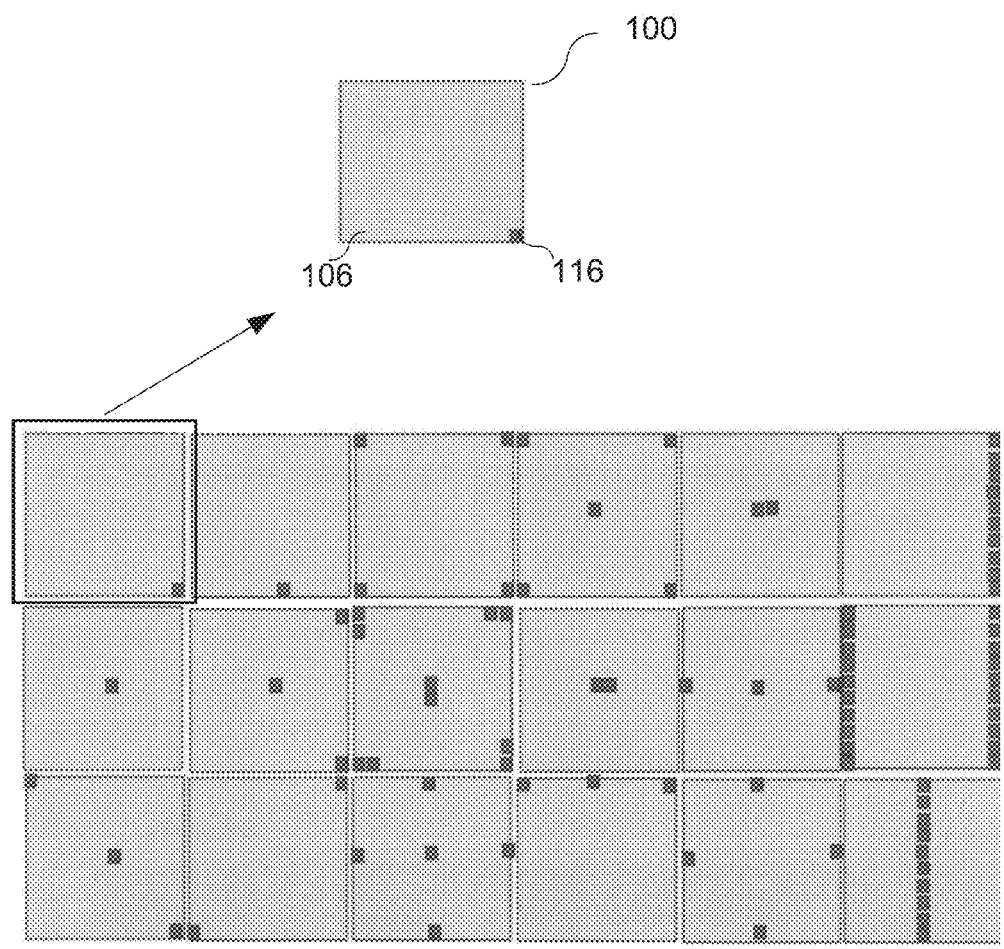
FIG. 4 shows schematic plan views of different embodiments of an optoelectronic component.

FIG. 4 shows schematic plan views of various embodiments of an optoelectronic component.

In accordance with one of the configurations described above, an optoelectronic component 100 may include an optically active structure 116 and an optoelectronic structure 106.

The optically active structure 116 may include one or a plurality of optically active (sub-)structures 116 formed identically or differently, wherein an optically active substructure 116 can be formed in accordance with one of the above-described configurations of the optically active structure 116.

The optically active structure 116 or the plurality of optically active (sub-)structures 116 can have different arrangements with regard to the optoelectronic structure 106 in the optoelectronic component 100, for example at the edge of the optoelectronic structure 106, and/or can be surrounded by the optoelectronic structure 106.

In other words: the optically active structure 116 or the plurality of optically active (sub-)structures 116 can be formed outside the luminous area, i.e. the optically active region 206, of the optoelectronic component.

In various embodiments, an independent identification of front-side lighting and rear-side lighting of the optoelectronic component 100 is possible by a plurality of optically active (sub-)structures 116.

In various embodiments, an internal lighting with different circuits of a plurality of organic functional partial structures of the optically active region 206 of the optoelectronic structure 106 is possible by a plurality of optically active (sub-)structures 116.

In various embodiments, an individual lighting control of an optoelectronic component 100 with a plurality of organic functional partial structures of the optically active region 206 of the optoelectronic structure 106 is possible by a plurality of optically active (sub-)structures 116.

In various embodiments, it is possible to form a position sensor of an optoelectronic component 100 by a plurality of optically active (sub-)structures 116.

Figure 5:
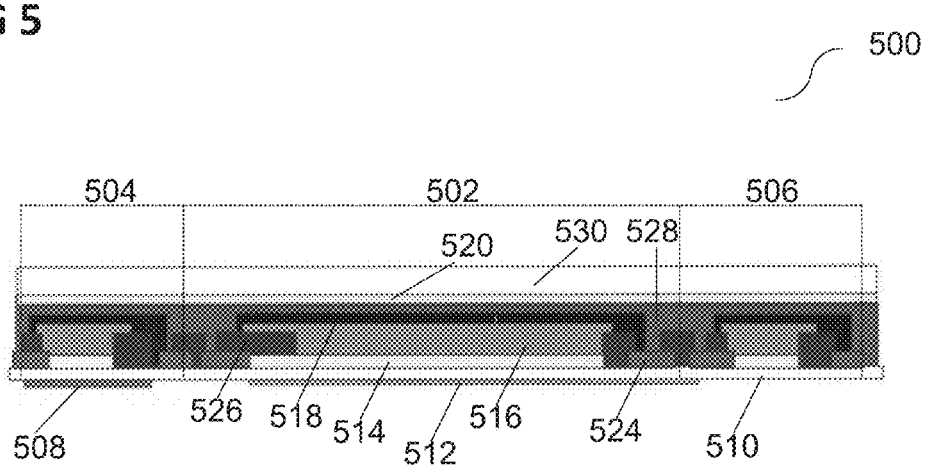
FIG. 5 shows a conventional optoelectronic component.

FIG. 5 shows a conventional optoelectronic component including an organic light emitting diode 502, a first photosensor 504 and a second photosensor 506 on a common carrier 510.

The organic light emitting diode 502 includes two electrodes 514, 518 with an organic functional layer system 116 therebetween. The regions of opposite polarity are separated from one another by electrical insulations 526. Layers electrically connected in series are connected to one another by an electrical connection 524. The optoelectronic component 500 is encapsulated by a barrier layer 528, an adhesive layer 520 of a cover. The conventional optoelectronic component 500 includes a coupling-out layer 512 on the carrier 510.

The first photosensor 506 measures the light guided in the carrier 510, i.e. the external light.

The second photosensor 504 measures the light guided in the carrier 510 and, for this purpose, is optically isolated with a permanent cover 508 with regard to the external light, that is to say that the second photosensor 504 measures the light of the organic light emitting diode.

In various embodiments, an optoelectronic component and a method for producing an optoelectronic component are provided which enable an exact automatic readjustment of the optoelectronic properties of an optoelectronic component with just a single photosensor. By way of example, the circuit complexity for a brightness-readjusted OLED can be reduced as a result. Furthermore, an independent detection of ambient light and light emitted by the optoelectronic component is made possible. Just one individual photosensor can carry out all measurements by itself, as a result of which the number of photosensors can be reduced. Furthermore, a lateral adaptation for detecting the internal electromagnetic radiation is optional, as a result of which freedom of design is made possible. Furthermore, the number of different sensors can be reduced, as a result of which, for example, the luminous area can be increased. In other words: with just one sensor, both the internal and the external rear-side and front-side lighting can thereby be detected independently and this can then be used for active luminance control of an OLED.

Furthermore, it is possible to use a process implementation for producing the optoelectronic components similar or identical to the conventional process implementation, for example in the case of OLED production without additional complexity and without additional costs in comparison with conventional surface emitters. Furthermore, by way of example, the radiation power of the surface lighting element can be adapted to external conditions and to aging phenomena of the light source, as a result of which energy can be saved. Furthermore, it is possible to set a constant lighting condition at the location of the surface emitter or of the photosensor, for example in production environments sensitive to light fluctuations. Furthermore, by way of example, it is possible to realize an automated readjustment of the lighting by electronic circuits in a manner dependent on the light intensity of the lighting element.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
   an optoelectronic structure formed for providing a first electromagnetic radiation; and
   a measuring structure formed for measuring electromagnetic radiation, wherein the measuring structure comprises an optically active structure and at least one electro-optical structure;
   wherein the optically active structure is optically coupled to the optoelectronic structure;
   wherein the optically active structure is formed for taking up an electromagnetic radiation in such a way that the optically active structure generates a measurement signal from the electromagnetic radiation taken up, wherein the electromagnetic radiation taken up at least partly comprises the first electromagnetic radiation and/or at least one second electromagnetic radiation of an external radiation source; and
   wherein the electro-optical structure is formed in such a way that the electro-optical structure has an adjustable transmittance, such that the proportion of the second electromagnetic radiation impinging on the optically active structure is adjustable; and a waveguide formed in such a way that the optoelectronic structure, the optically active structure and/or the electro-optical structure are/is optically coupled to the waveguide such that the electromagnetic radiation taken up in the optically active structure is capable of traveling between optically active structure and the optoelectronic structure and/or the electro-optical structure.

2. The optoelectronic component as claimed in claim 1, wherein the optoelectronic structure comprises at least one organic functional layer structure between a first electrode and a second electrode, wherein the organic functional layer structure comprises at least one electroluminescent layer.

3. The optoelectronic component as claimed in claim 1, wherein the optically active structure comprises an organic functional layer structure comprising at least one electroluminescent layer.

4. The optoelectronic component as claimed in claim 1, wherein the optically active structure and the optoelectronic structure are formed alongside one another.

5. The optoelectronic component as claimed in claim 1, wherein the electro-optical structure comprises or is formed as at least one of the following electro-optical structures:
  a mirror having electrically tunable reflectivity;
  a filter having electrically tunable absorption; and/or
  a diaphragm having electrically tunable transmission.

6. The optoelectronic component as claimed in claim 1, further comprising:
  an encapsulation structure, wherein the encapsulation structure is formed in such a way that the optically active structure and the optoelectronic structure are hermetically sealed with regard to indiffusion of water and/or oxygen.

7. The optoelectronic component as claimed in claim 6, wherein the electro-optical structure is formed on or above the encapsulation structure.

8. The optoelectronic component as claimed in claim 1, further comprising:
  a control device, wherein the control device is formed for electrically driving the optoelectronic structure and/or the electro-optical structure.

9. The optoelectronic component as claimed in claim 8, wherein the control device is formed in such a way that the control device controls an optical property of the electro-optical structure.

10. The optoelectronic component as claimed in claim 8, wherein the control device is formed in such a way that the control device controls the first electromagnetic radiation of the optoelectronic structure in at least one wavelength range.

11. The optoelectronic component as claimed in claim 1, wherein the optoelectronic component is formed as a lighting device.

12. A method for producing an optoelectronic component, the method comprising:
  providing a waveguide,
  forming an optoelectronic structure, formed for providing a first electromagnetic radiation; and
  forming a measuring structure formed for measuring electromagnetic radiation,
  wherein forming the measuring structure comprises forming an optically active structure and forming at least one electro-optical structure;
  wherein the optically active structure is optically coupled to the optoelectronic structure;
  wherein the optically active structure is formed for taking up an electromagnetic radiation in such a way that the optically active structure generates a measurement signal from the electromagnetic radiation taken up, wherein the electromagnetic radiation taken up at least partly comprises the first electromagnetic radiation and/or at least one second electromagnetic radiation of an external radiation source; and
  wherein the electro-optical structure is formed in such a way that the electro-optical structure has an adjustable transmittance, such that the proportion of the second electromagnetic radiation impinging on the optically active structure is adjustable; and
  wherein the waveguide is formed, and the optoelectronic structure and the measuring structure are formed, in such a way that the optoelectronic structure, the optically active structure and/or the electro-optical structure are/is optically coupled to the waveguide such that the electromagnetic radiation taken up in the optically active structure is capable of traveling between optically active structure and the optoelectronic structure and/or the electro-optical structure.

* * * * *